(12) United States Patent
Bode et al.

(10) Patent No.: US 8,115,516 B2
(45) Date of Patent: Feb. 14, 2012

(54) CIRCUIT ARRANGEMENT FOR FILTERING UNWANTED SIGNALS FROM A CLOCK SIGNAL, PROCESSING SYSTEM AND METHOD OF FILTERING UNWANTED SIGNALS FROM A CLOCK SIGNAL

(75) Inventors: Hubert Bode, Haar (DE); Andreas Laudenbach, Haag (DE); Andreas Roth, Guenzenhausen (DE); Engelbert Wittich, Wartenberg (DE)

(73) Assignee: Freescale Semiconductor, Inc., Austin, TX (US)

( * ) Notice: Subject to any disclaimer, the term of this patent is extended or adjusted under 35 U.S.C. 154(b) by 233 days.

(21) Appl. No.: 12/664,028

(22) PCT Filed: Jun. 14, 2007

(86) PCT No.: PCT/IB2007/052255
§ 371 (c)(1),
(2), (4) Date: Dec. 10, 2009

(87) PCT Pub. No.: WO2008/152456
PCT Pub. Date: Dec. 18, 2008

(65) Prior Publication Data
US 2010/0164569 A1    Jul. 1, 2010

(51) Int. Cl.
*G01R 29/02* (2006.01)

(52) U.S. Cl. .................... 327/34; 327/20; 327/27

(58) Field of Classification Search ............... 327/20, 327/24–27, 34, 35
See application file for complete search history.

(56) References Cited

U.S. PATENT DOCUMENTS

| | | | |
|---|---|---|---|
| 4,389,622 A | 6/1983 | Kackman | |
| 5,812,250 A * | 9/1998 | Ishida et al. | 356/28.5 |
| 6,535,024 B1 * | 3/2003 | Rochard | 327/34 |
| 7,592,843 B1 * | 9/2009 | Fong | 327/34 |
| 2003/0058013 A1 | 3/2003 | Cole | |

FOREIGN PATENT DOCUMENTS

| | | |
|---|---|---|
| GB | 1452559 | 10/1976 |
| JP | 2006-005576 | 1/2006 |

OTHER PUBLICATIONS

PCT/IB2007/052255 International Search Report and Written Opinion mailed Jun. 6, 2008.

* cited by examiner

*Primary Examiner* — Hai L Nguyen

(57) ABSTRACT

A circuit arrangement for detecting unwanted signals on a clock signal comprises an input for receiving the clock signal, and a Phase Lock Loop PLL circuit having a reference input coupled to the input of the circuit arrangement for receiving the clock signal and an output for providing a PLL output signal. The circuit arrangement further comprises a detector coupled to the output of the PLL circuit and to the input of the circuit arrangement. The detector is arranged to identify correct transitions in the clock signal using the PLL output signal, and to remove incorrect transitions due to unwanted signals from the clock signal so as to provide a filtered clock signal at an output of the circuit arrangement.

19 Claims, 4 Drawing Sheets

CIRCUIT ARRANGEMENT FOR FILTERING UNWANTED SIGNALS FROM A CLOCK SIGNAL, PROCESSING SYSTEM AND METHOD OF FILTERING UNWANTED SIGNALS FROM A CLOCK SIGNAL

FIELD OF THE DISCLOSURE

This disclosure relates to a circuit arrangement for filtering unwanted signals from a clock signal, a processing system including the circuit arrangement and a processing unit and a method of filtering unwanted signals from a clock signal.

BACKGROUND

It is known to use external oscillator circuits coupled to clock processing units such as microcontrollers or similar processing units. For example, in automotive applications, external quartz crystal oscillator circuits are used to clock microcontrollers that perform functions such as climate control and window lift control. In applications, such as automotive applications, networking, mobile phones, computing or similar applications, in which electrical circuits can be subjected to operating conditions which can cause disturbances, such as electromagnetic disturbances, the disturbances may produce unwanted signals or spikes on the clock signal which may cause logic to malfunction causing code runaway or application failures. Such failures can cause the application to crash with no further control other than resetting or restarting of the microcontroller which is undesirable.

Software techniques can be used to reduce the impact of spikes on the clock signal but these techniques require complex software routines and the spikes may cause the microcontroller to reach a state from which it cannot recover before the spikes can be removed.

A further challenge in improving the robustness of systems against clock disturbances arise in distributed systems, such as systems using CAN or FlexRay or similar protocols since in such systems the clock signal generated by the external oscillator circuit is used by different devices (e.g. the microcontroller and the peripheral devices) in the distributed system. Thus, any solution which attempts to remove or filter the clock disturbances is required to ensure that the phase shift to clock signal generated by the oscillator circuit is minimised for distributed systems.

In distributed system, a solution would be to use a Phase Lock Loop (PLL) circuit as the time base for the microcontroller and an external oscillator circuit as the time base for the peripheral devices in the distributed system. However, such a solution requires additional circuitry to handle the different time base domains and is not robust against clock disturbances on the external oscillator nor against disturbances of the microcontroller time base due to the PLL circuit itself.

Japanese patent application JP2006-005576 describes a clock filter circuit comprising two low pass filters which act as a delay and a RS flip-flop to remove unwanted signals from the clock signal. The circuit is arranged such that the filtered clock signal is not delayed with respect to the input clock. However, the circuit described in this patent application uses analog filters to act as delays and due to the variations of such analog filters over temperature and voltage such a circuit does not provide sufficient robustness for applications requiring enhanced protection against clock disturbances.

There is therefore a need to improve the robustness of systems against disturbances which produce unwanted signals on the clock signal.

SUMMARY

The present invention provides a circuit arrangement for filtering unwanted signals from a clock signal, a processing system and a method of filtering unwanted signals from a clock signal as described in the accompanying claims.

BRIEF DESCRIPTION OF THE DRAWINGS

A circuit arrangement for filtering unwanted signals from a clock signal, a processing system and a method of filtering unwanted signals from a clock signal in accordance with the present disclosure will now be described, by way of example only, with reference to the accompanying drawings in which.

DETAILED DESCRIPTION OF THE DRAWINGS

Figure 1:
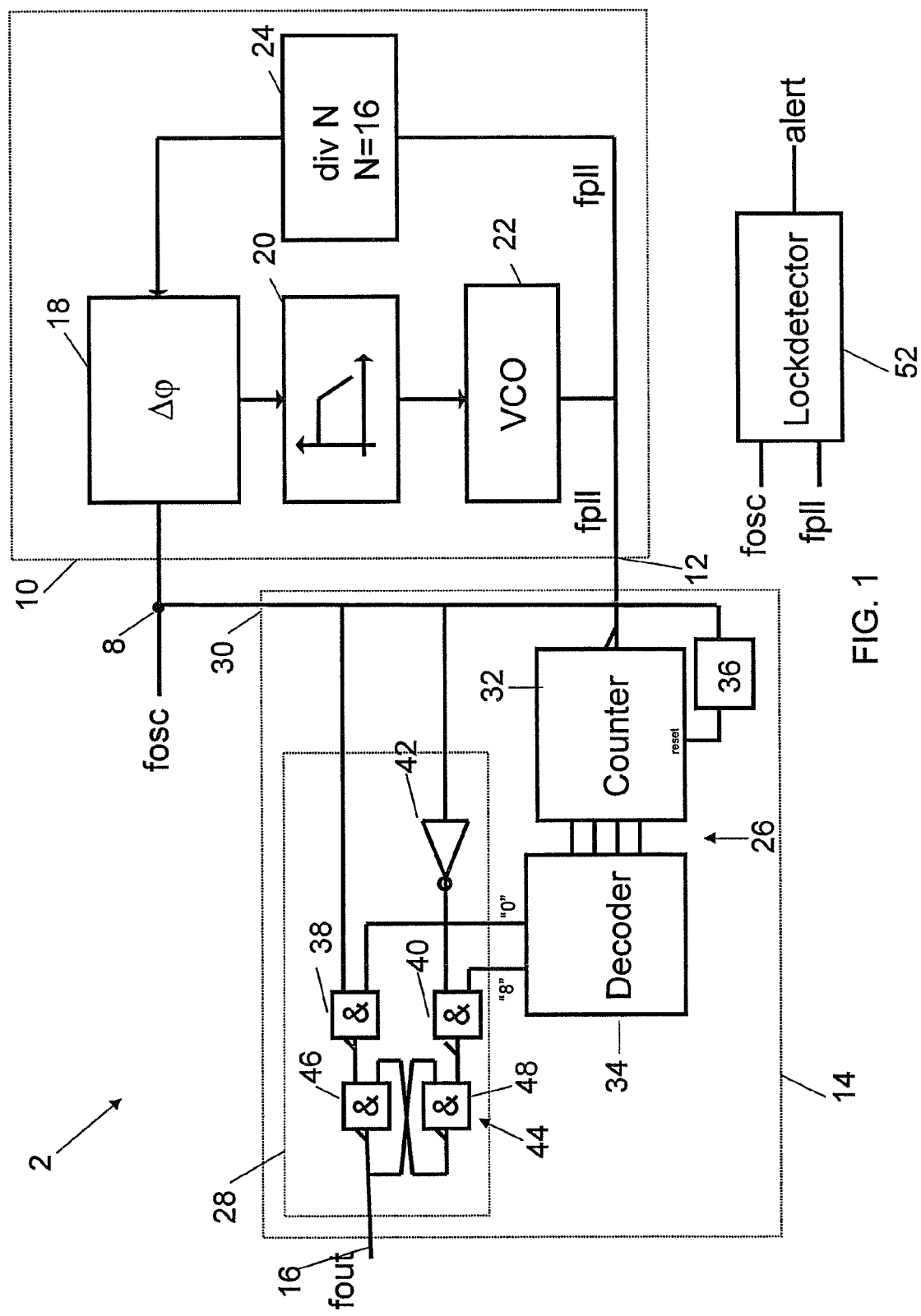
FIG. 1 is a simplified block schematic diagram of a circuit arrangement for filtering unwanted signals from a clock signal in accordance with an embodiment of the disclosure.

Referring firstly to FIG. 1, a circuit arrangement 2 in accordance with an embodiment of the disclosure for filtering unwanted signals from a clock signal fosc comprises an input 8 for receiving the clock signal fosc, a loop circuit 10 including a frequency multiplier 24 and having a reference input coupled to the input 8 so that the clock signal fosc is used to drive the loop circuit 10 and an output 12 for providing a loop output signal fpll. The frequency of the loop output signal fpll is a multiple of the frequency of the clock signal fosc. A detector 14 is coupled to the output 12 of the loop circuit 10 and to the input 8. The detector 14 uses the loop output signal fpll to identify correct transitions, such as edges of the clock signal, in the clock signal fosc and to remove incorrect edges due to unwanted signals from the clock signal fosc so as to provide a filtered clock signal fout at an output 16.

In an embodiment of the disclosure, the loop circuit 10 comprises a Phase Lock Loop (PLL) circuit 10. In another embodiment, the loop circuit 10 may comprise a Frequency Lock Loop (FLL) circuit (not shown). The operation of the loop ensures that the disturbances on the clock signal fosc are not transferred immediately to the loop output signal which loop output signal is used by the detector 14 to identify correct edges in the clock signal fosc. A FLL circuit is more complex to implement than a PLL circuit.

The PLL circuit 10 includes a phase detector 18, a loop filter 20, a Voltage Controlled Oscillator (VCO) 22 and a divider 24 for applying a frequency multiplication factor of N to the output of the VCO 22. The frequency of the VCO 22 is adjusted by a voltage corresponding to the phase difference between the output of the VCO 22 divided by the divider 24 and the clock signal fosc at the reference input. The output of the VCO 22 provides the output signal fpll at the output 12. The operation of such a PLL circuit 10 is well known in the art. The value of N is chosen to provide a stable PLL circuit 10, which will depend amongst other things on the technology used to implement the PLL circuit 10, and to ensure that a maximum frequency deviation given by equation 1 below can be tolerated by the circuit arrangement 2. In the embodiment shown in FIG. 1, N is chosen to be 16 and so the divider 24 is a divide by 16 divider.

$$f\text{extreme} = (1 + 1/N)f0 \qquad \text{Equation 1}$$

where:

fextreme is the maximum clock frequency which the receiver of the filtered clock must be able to tolerate without malfunction f0 is the desired (undisturbed) clock frequency.

The detector 14 includes a window generator 26 for generating first and second time windows based on the PLL output signal fpll and logic block 28 having a first input 30 coupled to receive the clock signal fosc at the input 8 and a second input coupled to the window generator 26 and an output for providing the filtered clock signal fout.

The first windows are arranged to be substantially coincident with expected first edges of the clock signal and the second windows are arranged to be substantially coincident with expected second edges of the clock signal. Substantially coincident in this context means that the expected time of arrival of the rising or falling edges of the clock signal fall within a period of time defined by the first or second windows respectively.

The logic block 28 is arranged to detect the expected first edges in the first window as correct edges and to detect the expected second edges in the second window as correct edges, and to remove any additional edges other than the detected first and second correct edges from the clock signal fosc.

In the embodiment shown in FIG. 1, the window generator 26 comprises a counter 32 for counting cycles of the PLL output signal fpll and decoding logic 34 coupled to the counter 32 for generating the first window at a first count of PLL cycles and for generating the second window at a second count of PLL cycles. In an embodiment, the counter 32 is a negative edge counter with Id(N) bits (rounded up to the next integer). The decoding logic 34 receives the count from the counter 32, and generates an output for coupling to the second input of the logic block 28, the output comprises two signals for defining the first and second windows. The windows are generated so as to correspond to when a rising edge and a falling edge of the clock signal are expected and hence for N=16, the count values at which the windows are generated correspond to zero and eight. With N=16, the counter 32 is a 4 bit counter and the first signal corresponds to a count of zero and the second signal corresponds to a count of eight. As will be explained in more detail below, the first and second windows correspond to the first and second signals at the output of the decoding logic 34 being active or going to high or logic '1' at a count of zero and a count of eight respectively. The length of the first and second windows when the first and second signals are high correspond to a period of the PLL output signal fpll and thus can be of short duration.

In an embodiment with N=16, the decoding logic 34 comprises a logic block (not shown) coupled to perform a NOR function on the counter bits 0 to 3 at the output of the counter 32 and to provide the first signal '0' and a logic block (not shown) coupled to perform a NOR function on the counter bits 0 to 2 ANDed with counter bit 3 and to provide the second signal '8'. The first signal '0' is high when the counter has the value zero (%0000) and is inactive or goes low or logic '0' for all the other counter values. The second signal '8' is high when the counter has the value eight (%1000) and goes low for all other counter values.

In an alternative embodiment, the decoding logic 34 may include logic (not shown) to compare the count of the counter 32 with the numbers 15 and 7 and the compare signals coupled to the input of d-type flip-flops (not shown) clocked by the PLL output signal fpll. The output of the d-type flip-flops provide the first '0' and second '8' signals at the output of the decoding logic 34. An advantage of such a decoding logic is that spikes due to slightly different timings in the logic which may open short wrong windows is avoided.

In the embodiment shown in FIG. 1, the logic block 28 comprises a first NAND gate 38 having a first input coupled to receive the clock signal fosc and a second input coupled to receive the first signal for defining the first window and a second NAND gate 40 having a first input coupled to receive the inverse of the clock signal fosc and a second input coupled to receive the second signal for defining the second window. The outputs of the first 38 and second 40 NAND gates are coupled to a RS flip-flop 44. The RS flip-flop 44 includes a first 46 and second 48 RS NAND gates with the first RS NAND gate 46 having a first input coupled to the output of the first NAND gate 38 and a second input coupled to the output of the second RS NAND gate 48 and an output coupled to the output 16 for providing the filtered clock signal fout and with the second RS NAND gate 48 having a first input coupled to the output of the second NAND gate 40 and a second input coupled to the output of the first RS NAND gate 46 and an output coupled to a counter reset element 36. The RS flip-flop 44 operates to ensure that only the first edge of the clock signal fosc in the first and second windows is passed through to the filtered clock signal fout. This allows for the circuit arrangement 2 to detect and remove additional edges that appear in the first and second windows. In other words, the RS flip-flop 44 allows for the circuit arrangement to detector double edges in the clock signal fosc.

When a correct rising edge is detected in a first window, the counter is resynchronised and reset to zero (%000) via the logic block 28 and the counter reset element 36 coupled to a reset input of the counter 32 in order to avoid false filtering and then the counting of the PLL cycles begins again. The counter is held in a reset state %0000 as long as the PLL circuit 10 is not in a locked state. Once the PLL circuit 10 is in a locked state, the reset of the counter 32 by the counter reset element 36 is allowed for one cycle of the PLL output signal fpll and then suppressed as long as the PLL circuit 10 is in a locked state. More details of the counter reset element 36 is provided in FIG. 5 and the accompanying description.

The first and second windows for N=16 are at least six PLL clock cycles or periods separated so no clock signal faster than fpll/13 (13=6+7 clock cycles since the counter 32 is only resynchronised on the rising edge via counter reset element 36) is passed through to the filtered clock signal fout at output 16.

Figure 2:
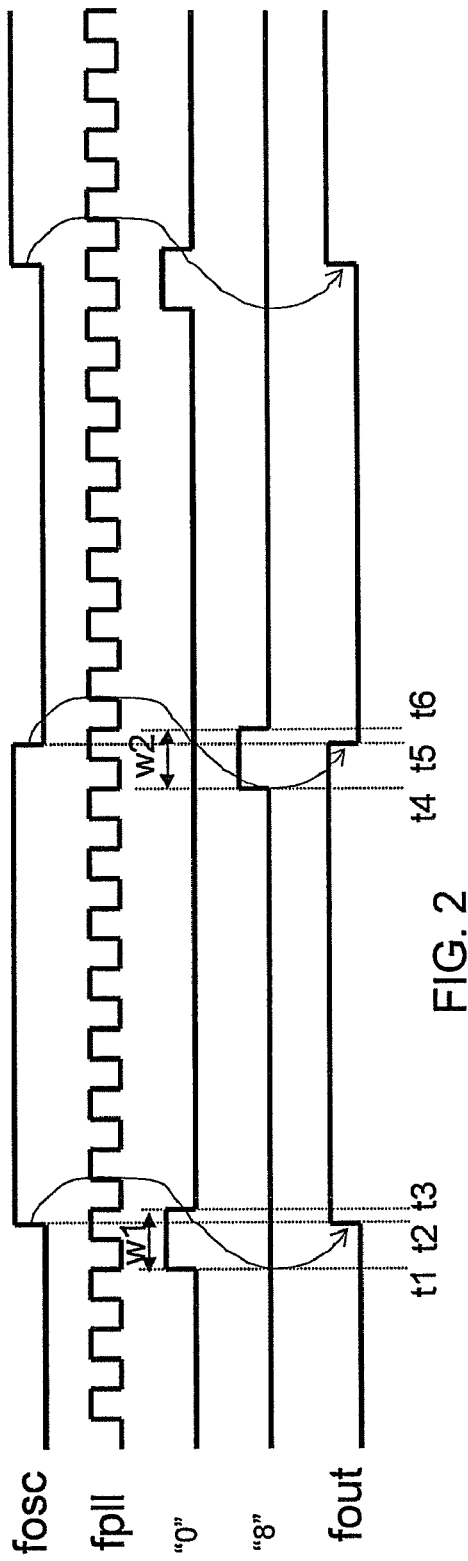
FIG. 2 is a timing diagram of signals at different nodes of the circuit arrangement of FIG. 1 for a received clock signal with no unwanted signals.
Figure 3:
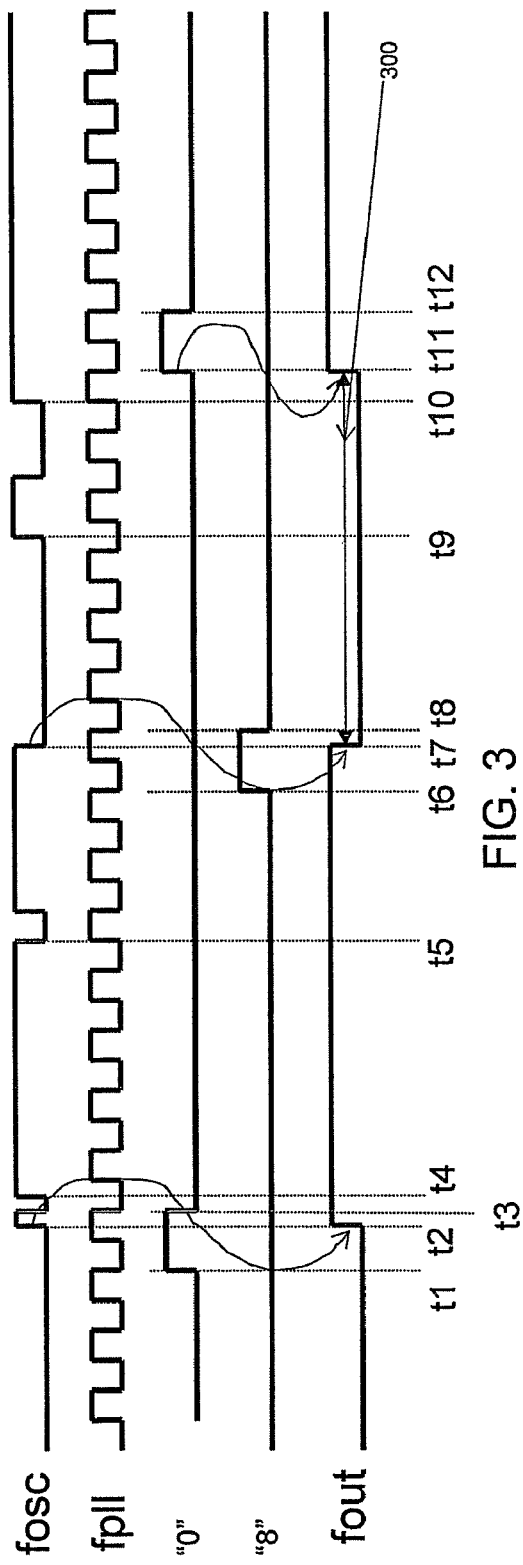
FIG. 3 is a timing diagram of signals at different nodes of the circuit arrangement of FIG. 1 for a received clock signal with unwanted signals.

The operation of the circuit arrangement 2 in accordance with an embodiment will now be described with reference to FIGS. 1-3. FIG. 2 shows the operation of the circuit arrangement 2 for the case when the clock signal is undisturbed and FIG. 3 shows the operation of the circuit arrangement 2 for the case when the clock signal is disturbed.

Referring firstly to FIG. 2, at time t1, the PLL circuit 10 is running, the count of the counter 32 is zero and so the first signal "0" at the output of the decoding logic 34 is switched from low to high (from logic 0 to logic 1) for a PLL clock period so as to define a first window of length w1. At time t2, the clock signal fosc switches from low to high (from logic 0 to logic 1) and the logic block 28 detects a rising edge of the clock signal in the first window by means of the first signal "0" which results in the output of the logic block 28 and hence the filtered clock signal fout at the output 16 switching from low to high. At time t3, the counter 32 receives the next cycle of the PLL output signal fpll which makes the count go to one and as a result the decoding logic 34 drives the first signal "0" low.

When the count of the counter 32 is eight after eight cycles of the PLL output signal fpll, at time t3 the decoding logic 34 switches the second signal "8" from low to high for a PLL clock period so as to define a second window of length w2. At time t5, the clock signal fosc switches from high to low (from logic 1 to logic 0) and the logic block 28 detects a falling edge of the clock signal in the second window by means of the second signal "8" which results in the output of the logic block 28 and hence the filtered clock signal fout at the output 16 switching from high to low. Due to the operation of the RS flip-flop 44, the output of the second RS NAND gate 48 goes high. At time t6, the counter 32 receives the next cycle of the PLL output signal fpll which makes the count go to nine and as a result the decoding logic 34 drives the second signal "0" low.

The counter 32 then continues to count the cycles of the PLL output until the count value reaches zero at time t7 at which time the first signal "0" at the output of the decoding logic 34 is switched from low to high and the process continues.

From the above description, it can therefore be seen that the clock signal fosc at the input 8 is used to drive the PLL circuit 10 and once the PLL circuit 10 is in a locked state and with no disturbances on the input clock signal fosc, the filtered clock signal at the output 16 corresponds to the input clock signal fosc with the same phase accuracy as fosc itself, so there is no degradation of the precision of the clock frequency.

Referring now to FIG. 3, at time t1, the PLL circuit 10 is running, the count of the counter 32 is zero and so the first signal "0" at the output of the decoding logic 34 is switched from low to high (from logic 0 to logic 1) for a PLL clock period so as to define a first window of length w1. At time t2, the clock signal fosc switches from low to high (from logic 0 to logic 1) and the logic block 28 detects a rising edge of the clock signal in the first window by means of the first signal "0" which results in the output of the logic block 28 and hence the filtered clock signal fout at the output 16 switching from low to high. The counter 32 will overflow and will count the cycles of the PLL output signal fpll from zero. At time t3, the first signal "0" goes low.

A disturbance to the clock signal fosc is shown to occur at time t3 which disturbance results in additional incorrect edges occurring on the clock signal fosc, including an incorrect rising edge at time t4. Since these incorrect edges due to unwanted signals on the clock signal occur outside of the first window as defined by first signal "0" going high, the logic block 28 ignores the incorrect edges such that the incorrect edges are not passed to the filtered clock signal fout. The filtered clock signal fout remains high at time t4. The disturbance to the clock signal fosc at time t5 is ignored in the same way. Even if a double edge disturbance (such as that occurring at t3) occurred inside the first window w1, the second edge would be filtered out by the RS flip-flop 44 because the RS flip-flop 44 is double reset with only the first edge being passed through.

When the count of the counter 32 is eight after eight cycles of the PLL output signal fpll, at time t6 the decoding logic 34 switches the second signal "8" from low to high. At time t7, the clock signal fosc switches from high to low and the logic block 28 detects a falling edge of the clock signal in the second window by means of the second signal "8" which results in the output of the logic block 28 and hence the filtered clock signal fout at the output 16 switching from high to low. At time t8, the second signal "0" goes low.

A disturbance to the clock signal fosc is shown to occur at time t9 which disturbance results in additional incorrect edges occurring on the clock signal fosc. Since these incorrect edges due to unwanted signals on the clock signal occur outside of the second or first window as defined by the second signal '8" or first signal "0" going high, the logic block 28 ignores the incorrect edges such that the incorrect edges are not passed to the filtered clock signal fout. The filtered clock signal fout remains high at time t9. The disturbance to the clock signal fosc at time t10 is ignored in the same way.

The counter 32 then continues to count the cycles of the PLL output until the count value reaches zero at time t11 at which time the first signal "0" at the output of the decoding logic 34 is switched from low to high. In this case, the clock signal fosc is already high and so in response to the first signal "0" going high, the logic block 28 switches its output and hence the filtered clock signal fout at the output 16 from low to high at time t11. Due to the disturbance to the clock signal fosc, the half period 300 of the filtered clock signal fout between t7 and t11 is less than when there is no disturbance to the clock signal. However, since the edges of the clock signal fosc are only passed to the output 16 during the first and second windows, the half period of the filtered clock signal fout will not be less than 6/fpll (when N=16).

At time t12, the first signal "0" goes low.

Although not shown in FIG. 3, in the event that a disturbance occurs such that more than one edge (rising or falling) occurs in one of the first or second windows, due to the operation of the RS flip-flop 44, additional edges after the first detected edge are ignored and are treated as incorrect edges which are not passed to the filtered clock signal fout.

From the above description, it can therefore be seen that the circuit arrangement 2 removes the incorrect edges from the clock signal fosc at the input 8 and the filtered clock signal at the output 16 corresponds to the filtered input clock signal fosc.

In an embodiment, the circuit arrangement 2 may include error detector for generating an error signal when either an expected first edge is not detected in the first window or an expected second edge is not detected in the second window.

The circuit arrangement 2 in accordance with an embodiment of the disclosure may include lock detector 52 for detecting when the PLL circuit 10 is not in a locked state and for generating an alert signal when the PLL circuit 10 is not in a locked state. The lock detector 52 has a first input for receiving the PLL output signal fpll and a second input for receiving the clock signal fosc and is arranged to compare the PLL output signal fpll and the clock signal fosc and to generate the alert signal when the PLL output signal fpll deviates from the clock signal fosc by a predetermined amount.

Figure 5:
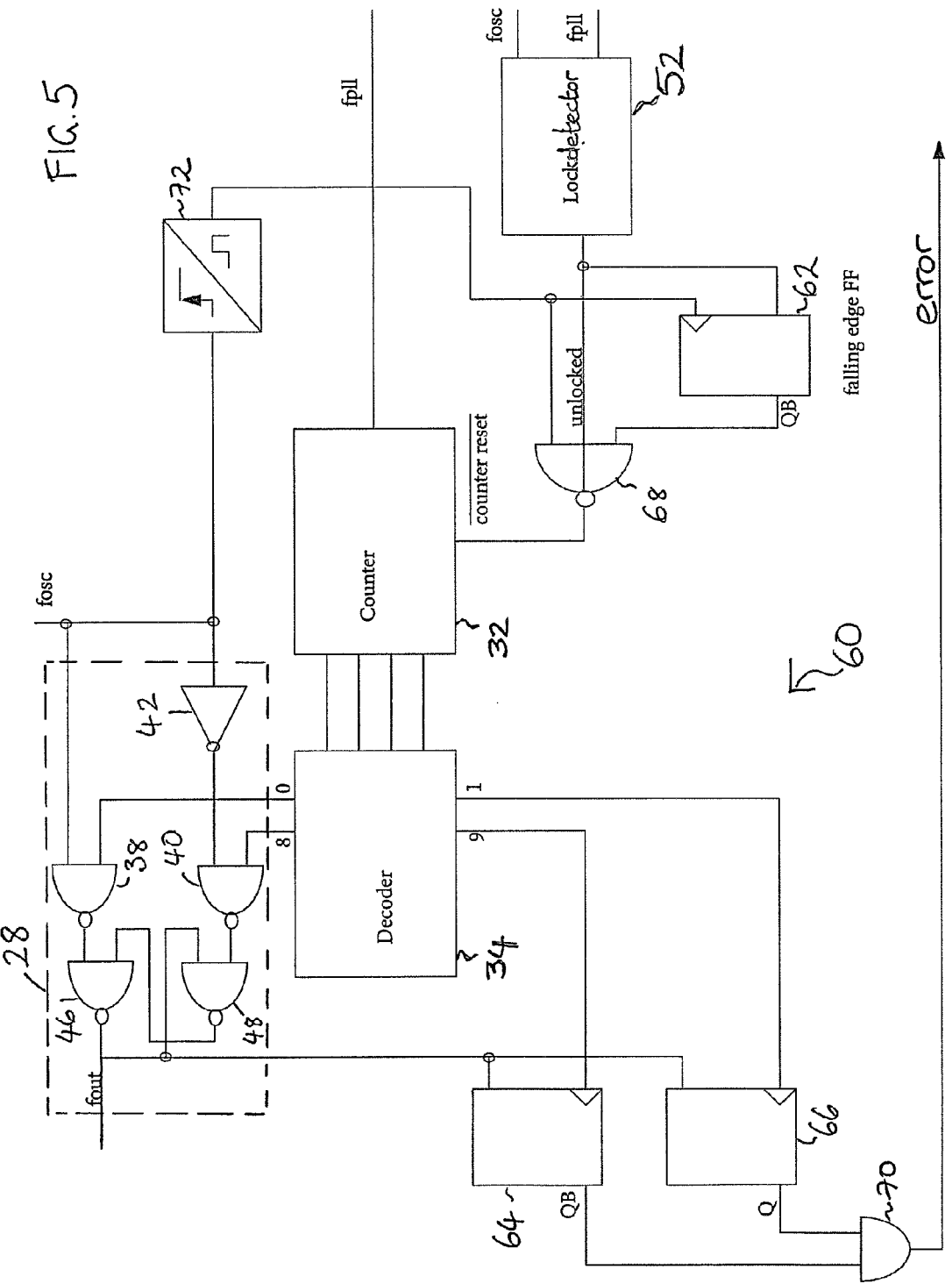
FIG. 5 is a simplified block schematic diagram showing part of the circuit arrangement of FIG. 1, including an error detector in accordance with an embodiment of the disclosure.

FIG. 5 shows an example implementation of such an error detector 60 and also an example implementation of the counter reset element 36 in the circuit arrangement 2 of FIG. 1. FIG. 5 only shows some of the features of the circuit arrangement 2 and like components to those of FIG. 1 are referenced by the same reference numeral. The error detector 60 comprises gated flip-flops 66, 64 and an AND gate 70 having an output for providing an error signal. The counter reset element 36 includes a gated flip-flop 62, and a NAND gate 68 which are coupled to receive the output of the lock detector 52 and together with a rising edge detector 72 are used to reset the counter 32 in order to synchronise the counter 32 to the expected time when a rising edge is expected on the clock signal fosc at the input 8. The signals at the output of the gated flip-flops 62, 64, 66 marked with the letter B, are active at logic low or zero.

The logic arrangement of FIG. 5 functions as follows. As long as the lock detector 52 generates a signal at its output indicating the PLL circuit 10 is in an unlocked state, the counter 32 is held at zero (%0000): that is, in a state ready to receive a rising edge. When the lock detector 52 generates a signal at its output indicating the PLL circuit 10 is in a locked state (e.g. fpll and fosc are in phase), the counter 32 is held at zero until the first rising edge is detected on the clock signal fosc at the input 8 via rising edge detector 72. Whilst the PLL circuit 10 remains in a locked state, the counter 32 counts the cycles of the PLL output signal fpll from zero (%0000) to fifteen (%1111) and then overflows to zero (%0000) again and there is no need to resynchronise the counter 32. When the lock detector 52 generates a signal at its output indicating the PLL circuit 10 is in an unlocked state, for example, due to a disturbance on the clock signal fosc, the counter 32 is resynchronised and held at zero until the PLL circuit 10 is again in a locked state.

The error signal generated by the error detector 60 determines whether the filtered clock signal fout is mute (i.e. does not toggle between logic high or logic low). This is achieved by looking at the filtered clock signal fout for a count of one (%0001) and a count of nine (%10001). When the counter 32 has a count of one (%0001), the filtered clock signal fout should be a logic high or '1' because it should have switched to '1' when the counter had been at zero (%0000) and a rising edge had been received. If the filtered clock signal fout is not at a '1', the gated flip-flops 64, 66 and AND gate 70 generate the error signal indicating the filtered clock signal fout did not switch in time and there is a disturbance on the clock signal fosc. Similarly, when the counter 32 has a count of nine (%1001), the filtered clock signal fout should be a logic low or '0' because it should have switched to '0' when the counter had been at eight (%1000) and a falling edge had been received. If the filtered clock signal fout is not at a '0', the gated flip-flops 64, 66 and AND gate 70 generate the error signal indicating the filtered clock signal fout did not switch in time and there is a disturbance on the clock signal fosc.

Since an error signal is only generated when either the expected first edge is not detected in the first window or an expected second edge is not detected in the second window, the error signal therefore indicates that the clock signal fosc at the input 8 has been disturbed to an extent that it is corrupt and that corrective action needs to be taken by the system. The error signal can therefore be used to switch the system over to a safe internal oscillator and to notify the software to cause exception processing.

In an embodiment, the lock detector 52 comprises two counters (not shown)): a first counter counts the cycles of the clock signal fosc and the second counter counts the cycles of the PLL output signal fpll. With N=16, when the PLL circuit 10 is in a locked state the ratio of the counts of the first and second counters should be 16. If the ratio of the counts of the first and second counters is not 16, then this is an indication that the PLL circuit 10 is not in a locked state and the lock detector 52 can generate an alert signal. The alert signal could therefore be used to indicate that the clock signal fosc is so corrupt or inaccurate that the PLL circuit 10 is not in a locked state. The PLL circuit 10 is designed so that an alert signal indicating an unlocked state is generated before the clock signal fosc at the input 8 is so corrupt it will cause system malfunction.

For clock signals generated by crystal-based oscillator circuits, the quality of the clock signal on start-up of the oscillator circuit could be checked by monitoring the output of the lock detector 52. For such a case, an alert signal generated when the PLL circuit 10 does not reach a locked state on start-up of the oscillator circuit would therefore indicate that the quality of the clock signal at start-up is poor.

Figure 4:
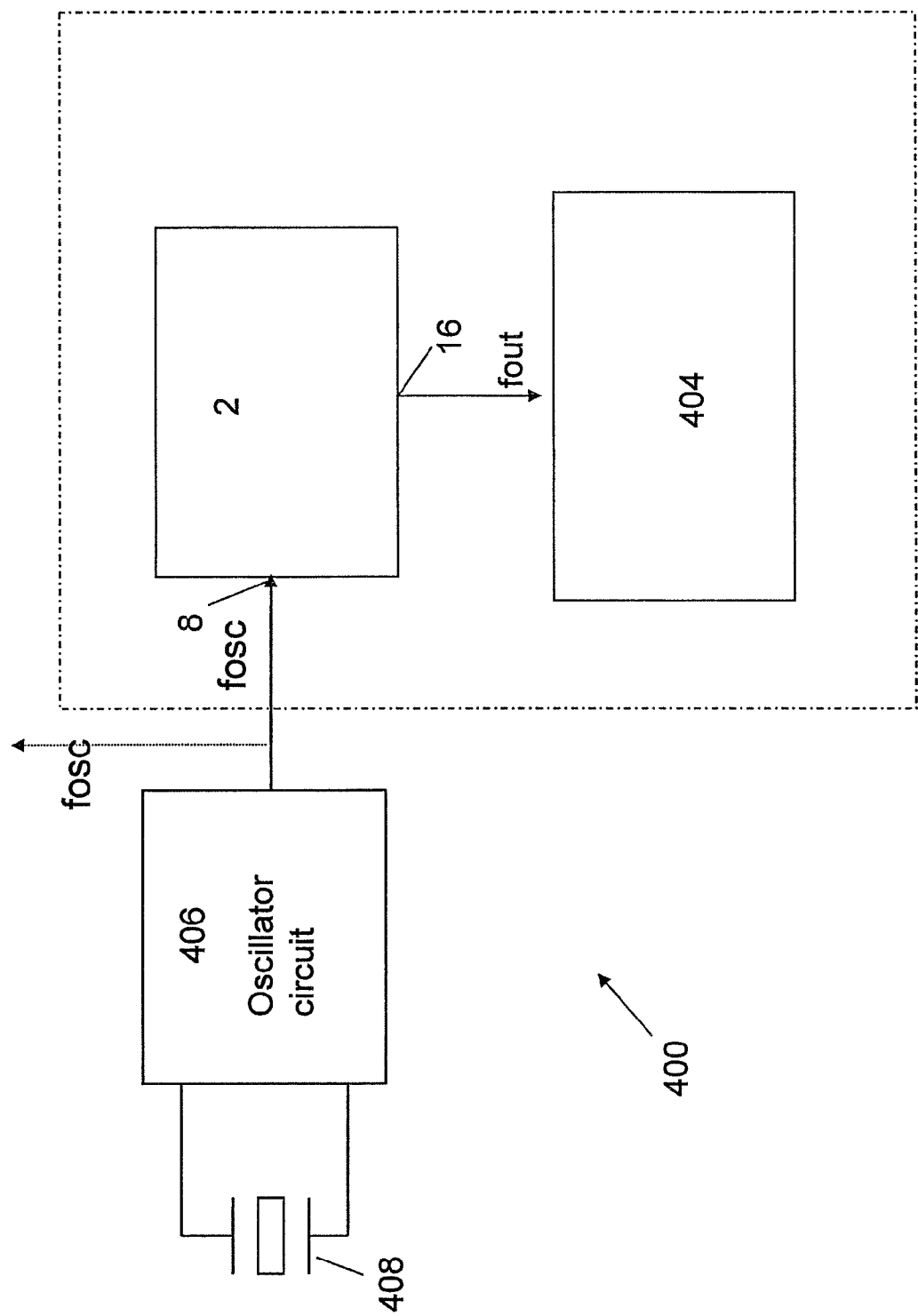
FIG. 4 is a simplified block schematic diagram showing a processing system comprising the circuit arrangement of FIG. 1.

FIG. 4 shows a processing system 400 comprising a circuit arrangement, such as the circuit arrangement 2 shown in FIG. 1, coupled to a processing unit 404, such as a microcontroller, microprocessor or similar device. The filtered clock signal fout at the output 16 of the circuit arrangement 2 is coupled to the processing unit such that timing of the processing unit is based on the filtered clock signal fout. An oscillator circuit 406 coupled to a crystal 408 provides the clock signal fosc to the input 8 of the circuit arrangement 2. In a distributed system, the clock signal fosc would also be provided to other devices in the distributed system as is indicated by the dotted arrow in FIG. 4. In an embodiment, the circuit arrangement and processing unit are integrated in the same integrated circuit. The crystal 408 is an external component and the oscillator circuit 406, which generates a clock signal, may be an external component, or may be part of the same package as the circuit arrangement 2 and processing unit 404.

When the disturbances on the clock signal fosc are significant, for example, as indicated by the fact that no edges are detected in the first and second windows and an error signal is generated by the error detector, corrective action can be taken by the system. For example, a secondary (slow) internal relaxation oscillator can be used as the clock signal to clock the processing unit 404 until the lock detector indicates that the system has restarted normal operation (i.e. when the PLL circuit 10 is in a locked state). Since the clock signal fosc provides the reference input to the PLL circuit 10, the frequency of the PLL output signal fpll moves slowly with the changes in frequency of the clock signal fosc at the reference input which means that the PLL output signal fpll can be used for a period of time in place of the corrupt clock signal fosc without impacting the performance of the system in an unwanted manner. In other words, the frequency of the PLL output signal fpll changes slowly and so there is time for the circuit arrangement 2 to indicate a fault so that corrective action can take place. The period of time for which the PLL output signal fpll can be used in place of the clock signal fosc generated by the oscillator circuit 406 depends on the design of the PLL circuit 10, the application and the lock detector 52.

The slower clock is used until the disturbances on the clock signal fosc have gone, for example, as indicated by an alert signal indicating that the PLL circuit 10 is in a locked state and by the error signal indicating that edges have been detected in the first and second windows at which point, the time base for the processing unit 404 can be switched to the clock signal fosc as filtered by the circuit arrangement 2.

In summary, the circuit arrangement in accordance with the present invention combines a PLL circuit with a detector for detecting and mitigating disturbances of a clock signal at its input. It will therefore be appreciated that the circuit arrangement in accordance with the disclosure can therefore act as an adaptive narrow bandwidth filter to filter unwanted signals from a clock signal at its input and provide a filtered clock signal at an output to be used as a time base for a processing unit of a system. The bandwidth of the circuit arrangement is defined by the design PLL circuit, for example, by choosing N=16. Thus, the unwanted signals can be filtered out prior to them entering the system and causing system malfunction such as code runaways.

Due to alerts generated by the lock detector and error detector, the circuit arrangement in accordance with the present invention also protects the processing unit from disturbances affecting the PLL circuit which could also result in a severe failure of the system.

The circuit arrangement in accordance with the disclosure can also monitor the clock signal at its input and provide error signals and alert signals to indicate whether the input clock signal meets certain predefined conditions. For example, the error signals and/or alert signals can indicate whether the frequency of the clock signal is too low or too high, the clock signal is corrupted due to unwanted signals and the quality of the clock signal at oscillator start-up which can be used by the system to take corrective action. Thus, by monitoring the state of the clock signal and providing error and alert signals to indicate when the quality of the clock signal is poor, the circuit arrangement in accordance with the disclosure ensures that the disturbance to the processing unit is minimised and does not extend to a state from which the processing unit cannot recover.

An advantage of the circuit arrangement in accordance with the disclosure is that since the PLL circuit uses the clock signal as a reference and the PLL output signal is used to identify correct edges in the clock signal, the circuit arrangement is isochronous with the clock signal and so there is no additional phase inaccuracies. This avoids the problems of the known arrangements which have phase inaccuracies which causes particular issues with distributed systems and so the filtered clock signal provided at the output of the circuit arrangement can be used for high quality clock demanding systems such as systems using CAN or similar protocols. In addition, by using the clock signal as the reference input to the PLL circuit, the frequency of the clock signal is not required to be known by the circuit arrangement in accordance with the disclosure.

Moreover, the short term frequency variation of the filtered clock signal fout caused by a deviation of the clock signal fosc at the input of the circuit arrangement or by a deviation of the PLL output signal fpll is limited to 1/N the frequency of the input clock signal fosc and N can be chosen to ensure that a processing unit can tolerate such a deviation.

The circuit arrangement in accordance with the present disclosure uses a PLL circuit and some additional logic circuitry in order to filter the clock signal. Since PLL circuits are already used to multiply the frequency of the clock signal to provide a time base of the appropriate frequency, the circuit arrangement in accordance with the disclosure does not require a significant number of 'extra' components and thus, the cost and space requirement impact is insignificant.

In the foregoing specification, the invention has been described with reference to specific examples of embodiments of the invention. It will, however, be evident that various modifications and changes may be made therein without departing from the broader scope of the invention as set forth in the appended claims.

For example, the detector 14 may be implemented by logic blocks different to the specific arrangement described with respect to the embodiment shown in FIG. 1. For example a positive edge counter may be used in place of the negative edge counter. Different values of N and hence different counts can be used to generate the first and second windows. The first and second windows may be generated by the output of the decoding logic 34 going low for the length of each window. Detecting a falling edge in a second window may be used to reset the counter 32.

The invention claimed is:

1. A circuit arrangement for detecting unwanted signals on a clock signal, the circuit arrangement comprising:
an input for receiving the clock signal;
a loop circuit including a frequency multiplier having a reference input coupled to the input of the circuit arrangement for receiving the clock signal and an output for providing a loop output signal, a frequency of the loop output signal being a multiple of a frequency of the clock signal;
a detector coupled to the output of the loop circuit and to the input of the circuit arrangement, the detector being arranged to identify correct transitions in the clock signal using the loop output signal, and to remove incorrect transitions due to the unwanted signals from the clock signal based on the loop output signal and the clock signal so as to provide a filtered clock signal at an output of the circuit arrangement.

2. The circuit arrangement of claim 1, wherein the loop circuit is one of a Phase Lock Loop PLL circuit or a Frequency Lock Loop FLL circuit.

3. The circuit arrangement according to claim 1, further comprising a lock detector for generating an alert signal when the PLL circuit or FLL circuit is not in a locked state.

4. The circuit arrangement of claim 3, wherein the lock detector has a first input for receiving the loop output signal and a second input for receiving the clock signal, the lock detector being arranged to compare the loop output signal and the clock signal and to generate the alert signal when the loop output signal deviates from the clock signal by a predetermined amount.

5. A processing system having an input for receiving a clock signal, the processing system comprising the circuit arrangement as claimed in claim 1, the input of the circuit arrangement being coupled to the input of the processing system and a processing unit coupled to the output of the circuit arrangement, wherein timing of the processing unit is based on the filtered clock signal.

6. The processing system of claim 5, further comprising an oscillator circuit for generating the clock signal.

7. The circuit arrangement according to claim 1, wherein the detector comprises:
a window generator for generating first and second time windows based on the loop output signal, the first windows being arranged to be substantially coincident with expected first transitions of the clock signal and the second windows being arranged to be substantially coincident with expected second transitions of the clock signal;
logic block having a first input for receiving the clock signal, a second input coupled to the window generator and an output for providing the filtered clock signal, the logic block being arranged to detect the expected first transitions in the first window as correct transitions and to detect the expected second transitions in the second window as correct transitions, and to remove any additional transitions other than the detected first and second correct transitions from the clock signal.

8. The circuit arrangement of claim 7, wherein the loop circuit is one of a Phase Lock Loop PLL circuit or a Frequency Lock Loop FLL circuit.

9. The circuit arrangement according to claim 7, further comprising an error detector for generating an error signal when at least one of the expected first transitions is not detected in the first window and the expected second transitions are not detected in the second window.

10. The circuit arrangement of claim 9, wherein the loop circuit is one of a Phase Lock Loop PLL circuit or a Frequency Lock Loop FLL circuit.

11. The circuit arrangement according to claim 7, wherein the logic block comprises a RS flip-flop having a set input for receiving rising transitions of the clock signal and a reset input for receiving falling transitions of the clock signal.

12. The circuit arrangement according to claim 11, further comprising an error detector for generating an error signal when at least one of the expected first transitions is not detected in the first window and the expected second transitions are not detected in the second window.

13. The circuit arrangement of claim 11, wherein the loop circuit is one of a Phase Lock Loop PLL circuit or a Frequency Lock Loop FLL circuit.

14. The circuit arrangement according to claim 7, wherein the window generator comprises:
a counter for counting cycles of the loop output signal; and
decoding logic for generating the first window at a first count of loop cycles and for generating the second window at a second count of loop cycles.

15. The circuit arrangement according to claim 14, wherein the logic block comprises a RS flip-flop having a set input for receiving rising transitions of the clock signal and a reset input for receiving falling transitions of the clock signal.

16. The circuit arrangement according to claim 14, further comprising an error detector for generating an error signal when at least one of the expected first transitions is not detected in the first window and the expected second transitions are not detected in the second window.

17. The circuit arrangement of claim 14, wherein the loop circuit is one of a Phase Lock Loop PLL circuit or a Frequency Lock Loop FLL circuit.

18. A method of filtering unwanted signals from a clock signal, the method comprising:
receiving the clock signal at an input of a circuit arrangement;
providing a loop output signal at an output of a loop circuit having a reference input coupled to receive the clock signal at the input of the circuit arrangement, a frequency of the loop output signal being a multiple of a frequency of the clock signal;
identifying by a detector coupled to the output of the loop circuit and to the input of the circuit arrangement correct transitions in the clock signal using the loop output signal; and
removing the incorrect transitions due to the unwanted signals from the clock signal based on the loop output signal and the clock signal so as to provide a filtered clock signal at an output of the circuit arrangement.

19. The method of claim 18, wherein the loop circuit is one of a Phase Lock Loop PLL circuit or a Frequency Lock Loop FLL circuit.

* * * * *